(12) United States Patent
Gordon

(10) Patent No.: US 8,026,440 B1
(45) Date of Patent: Sep. 27, 2011

(54) PASSIVELY COOLED, HIGH CONCENTRATION PHOTOVOLTAIC SOLAR CELL PACKAGE

(75) Inventor: Robert Gordon, Torrance, CA (US)

(73) Assignee: Amonix, Inc., Seal Beach, CA (US)

( * ) Notice: Subject to any disclaimer, the term of this patent is extended or adjusted under 35 U.S.C. 154(b) by 711 days.

(21) Appl. No.: 11/518,330

(22) Filed: Sep. 7, 2006

Related U.S. Application Data

(60) Provisional application No. 60/714,599, filed on Sep. 7, 2005.

(51) Int. Cl.
*H01L 31/052* (2006.01)

(52) U.S. Cl. .......................... 136/259; 136/246; 359/248

(58) Field of Classification Search .......... 136/243–265; 250/239, 200; 359/259, 248
See application file for complete search history.

(56) References Cited

U.S. PATENT DOCUMENTS

| | | | | |
|---|---|---|---|---|
| 1,687,284 A | * | 10/1928 | Dusold | 160/400 |
| 4,329,979 A | * | 5/1982 | Frank | 126/591 |
| 4,830,678 A | * | 5/1989 | Todorof et al. | 136/259 |
| 5,460,659 A | * | 10/1995 | Krut | 136/246 |
| 6,051,776 A | * | 4/2000 | Kimata et al. | 136/246 |
| 6,057,505 A | * | 5/2000 | Ortabasi | 136/246 |

OTHER PUBLICATIONS

Garboushian, V. et al, "A Novel High-Concentration PV Technology for Cost Competitive Utility Bulk Power Generation", Proc. 1st World Conference on Photovoltaic Energy Conversion. (1994) 1060-1063 (4 pages).*

Araki, K. et al, "Comparison of Efficiency Measurements for a HCPV Module with 3J Cells in 3 Sites", Photovoltaic Specialists Conference 2005. (2005) 846-849.*

* cited by examiner

*Primary Examiner* — Basia Ridley
*Assistant Examiner* — Christina Chern
(74) *Attorney, Agent, or Firm* — John K. Fitzgerald; Fulwider Patton LLP

(57) ABSTRACT

The solar cell modular unit has a minimal number of components each of which are easily manufactured and which also have a relatively economical cost. It has a laminar substrate having an electrically conductive layer on its top surface that includes the printed electrical circuit. The middle layer is heat conductive and not electrically conductive. The bottom layer is made of thermally conductive material. A solar cell is centrally mounted on the printed circuit board. A base assembly covers the solar cell and it has a vertical tunnel extending from its top surface to the solar cell. An elongated sun shield has an aperture in its top panel that aligns with the tunnel of the base assembly. The sun shield snap-locks onto the top of the base assembly. A secondary optical element telescopically mates with the aperture in the sun shield and the tunnel of the base assembly. A primary light ray refractive member is positioned at a predetermined spaced location above the SOE.

24 Claims, 8 Drawing Sheets

PASSIVELY COOLED, HIGH CONCENTRATION PHOTOVOLTAIC SOLAR CELL PACKAGE

This application claims priority of U.S. Provisional Patent Application No. 60/714,599 filed Sep. 7, 2005.

BACKGROUND

1. Field of Invention

The present invention relates to the design and assembly of a single photovoltaic modular unit and ancillary hardware into a modular package for use under highly concentrated sunlight to convert sunlight to electricity reliably and inexpensively.

2. Prior Art

In traditional one-sun solar panels, photovoltaic devices are tightly packed or coated onto a flat substrate to capture the radiation impinging on the surface. The cells are interconnected electrically and the entire unit is encapsulated to protect it from terrestrial elements. The tightly packaged cells minimize the area not covered by the photovoltaic material, making interconnection simple and encapsulation efficient. To make photovoltaics competitive with other energy sources, the cost of the system must come down. Since the photovoltaic material can be 50% or more of the system costs, one method to reduce this cost is to minimize the amount of photovoltaic material by concentrating the solar energy to a smaller area using refractive or reflective means. This method can require individual receiver packages for each solar cell to further decrease the material costs. The smaller discrete packages however, come with concomitant disadvantages including such things as increased difficulty in interconnection, encapsulation, mechanical alignment, and thermal management requirements associated with high concentration photovoltaics.

The requirements of such packages are typically at least as stringent as those seen in one-sun applications.

1. There is the requirement of high voltage isolation from ground potential (near 2000 VDC).

2. There is the need for the protection of any active electrical parts from moisture and the elements.

3. There is the need to dissipate a higher localized heat load present on the small photovoltaic cell due to high radiation fluxes intrinsic to concentrating the sunlight.

4. There is the need for all parts of the receiving unit to withstand highly concentrated sunlight either through a prudent choice of materials or a protective element in case on any errors in tracking.

5. There is the need to accurately redirect errant rays from the primary concentrator onto the cell due to concentrator manufacturing tolerances, imaging alignment errors, or sun tracking errors.

Prior attempts to meet all of these requirements have involved either expensive materials or many different parts, with a complex and expensive assembly process. Yields and throughput have suffered as a result. Reliability problems also have resulted due in part to the high piece part count.

SUMMARY OF THE INVENTION

The principal object of the present invention is to meet the varied requirements of a cell package under concentrated sunlight in an integrated manner. It secondarily allows for efficient manufacturability and assembly of the package ultimately bringing the cost of the system down.

The package consists of a thermally conductive material with high dielectric strength, laminated to a thermally conductive substrate on the bottom and to an electrically conductive layer on the top for the transport of the generated carriers. The substrate is of laminate construction allowing for the use of common printed circuit board technology widely available in many parts of the world. The dielectrics is highly thermally conductive allowing for a temperature rise across it of less than 10 degrees C. under operating conditions of 20 W/cm2. The lower temperatures not only increases the power output of a solar cell, but also extends its reliability. This substrate is then attached to a heat spreader that doubles as a structural element for optimal heat dissipation.

On the topside of the cell, a secondary optical element (SOE) is attached to or suspended above the substrate to capture the rays not focused by the primary element onto the cell. This primary element can take the form of a refractive element that bends the rays back onto the cell, or a reflective element that reflects errant rays back onto the cell. The element is correctly aligned with the lens and cell optical path through alignment pins fabricated into a holding base and holes fabricated into the substrate. This holding base is made from inexpensive material and also integrates the sealing function to help meet the moisture intrusion requirements. The base also allows for a simple interface with the protective element that covers any sensitive areas of the receiving unit to concentrated sunlight in the case of tracking error or loss. This protective sun-shield is made from a material that can accommodate the high fluxes and/or temperatures generated by concentrated sunlight. These might include materials such as aluminum, aluminized polymers, mirrored glass, ceramic, porcelain, clay, or fiberglass. Again, the sunshield has the ability to interface with the integrated SOE base/cowling in a snap fit for ease of assembly of the SOE.

This invention takes the various components and assembles them in a way that is more conducive to mass production. It allows for easy assembly of the entire package with minimal use of adhesives or fasteners by using "snap-fits" between many of the parts. This saves costs in both part numbers and assembly time. The substrate uses printed circuit board technology for ease of technology transfer between vendors and for ease of modification without any hard tooling costs. The secondary optical element utilizes a highly reflective material shaped to take advantage of cheap manufacturing methods. The SOE base has high tolerance alignment pins that register to the substrate to ensure proper alignment of the optical element to the cell. It secondarily acts to seal the package from water intrusion should moisture ever enter the module. It also allows for a snap-fit with the sunshield. Finally, the substrate is attached to the structural element which doubles as a heat spreader. A heat sink behind to enhance thermal dissipation.

DESCRIPTION OF THE PREFERRED EMBODIMENT

Figure 1:
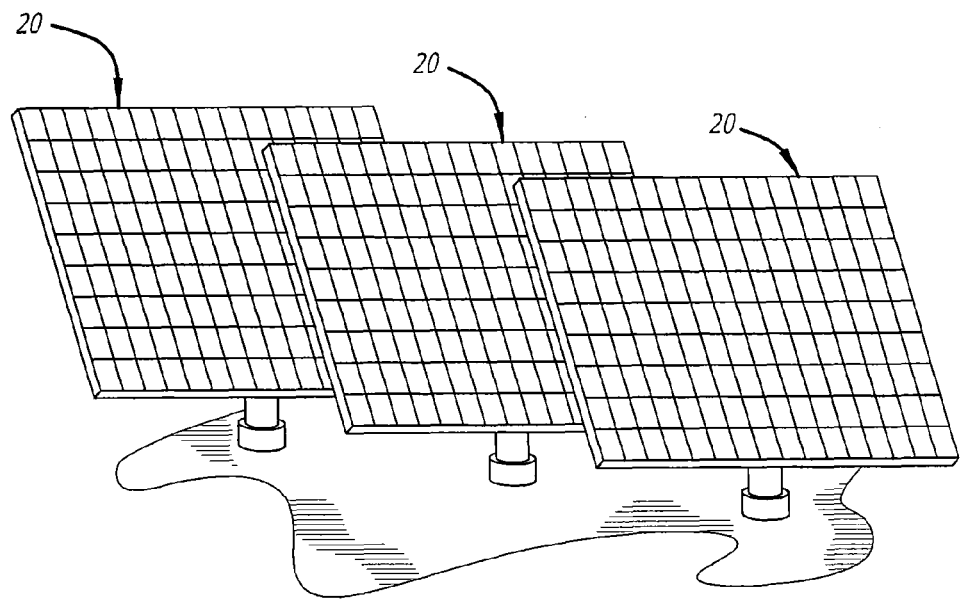
FIG. 1 is a front perspective view showing several solar arrays that utilize the solar modular unit.
Figure 2:
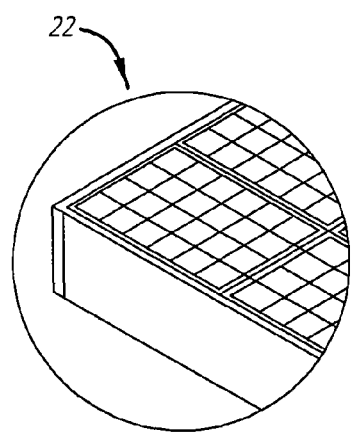
FIG. 2 shows one of the solar units of the solar array illustrated in FIG. 1.
Figure 3:
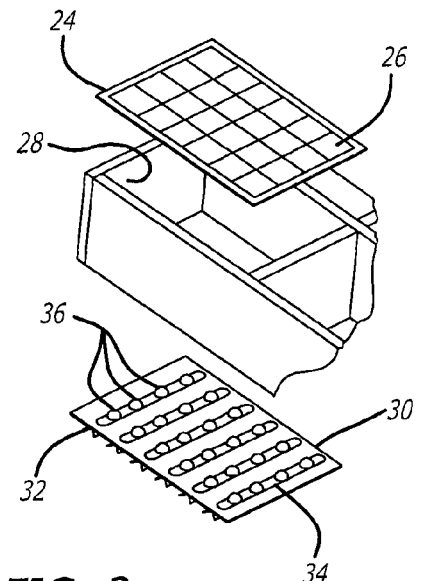
FIG. 3 is an exploded schematic view of the structure illustrated in FIG. 2.

The invention will now be discussed by referring to FIGS. 1-13 of the drawings. FIG. 1 is a front perspective view illustrating several solar power arrays 20. FIG. 2 shows one of the solar units 22 of the solar array. FIG. 3 is an exploded schematic view of FIG. 2 showing a Fresnel lens porquet 24 having multiple Fresnel lenses 26. The Fresnel lens porquet 24 is mounted on the top of compartment 28. Inside compartment 28 is a receiver plate 30 mounted on a heat sink 32. A plurality of sun shield strips 34 have individual solar cells 36 mounted on them.

Figure 4:
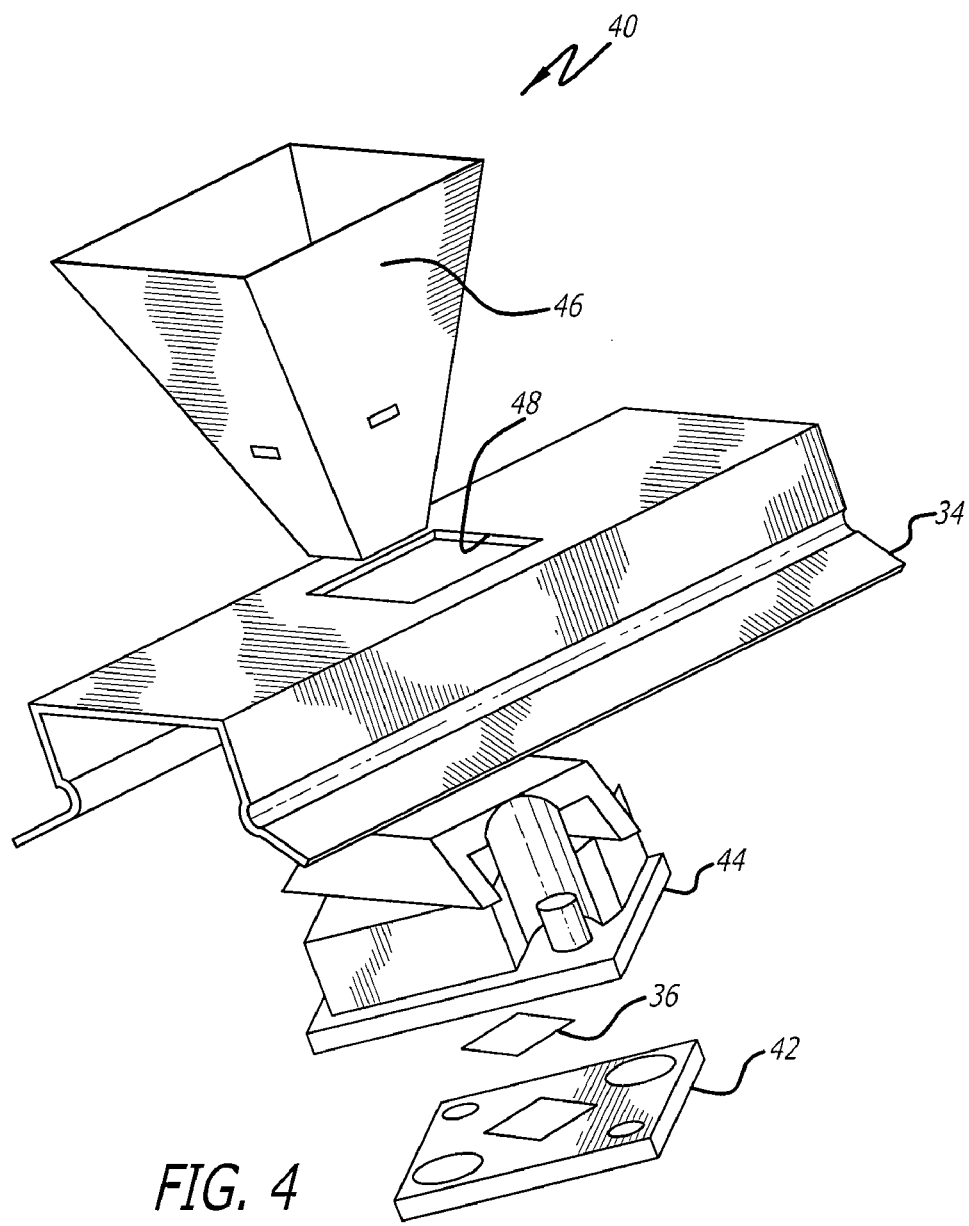
FIG. 4 is an exploded perspective view of the solar cell modular unit.
Figure 5:
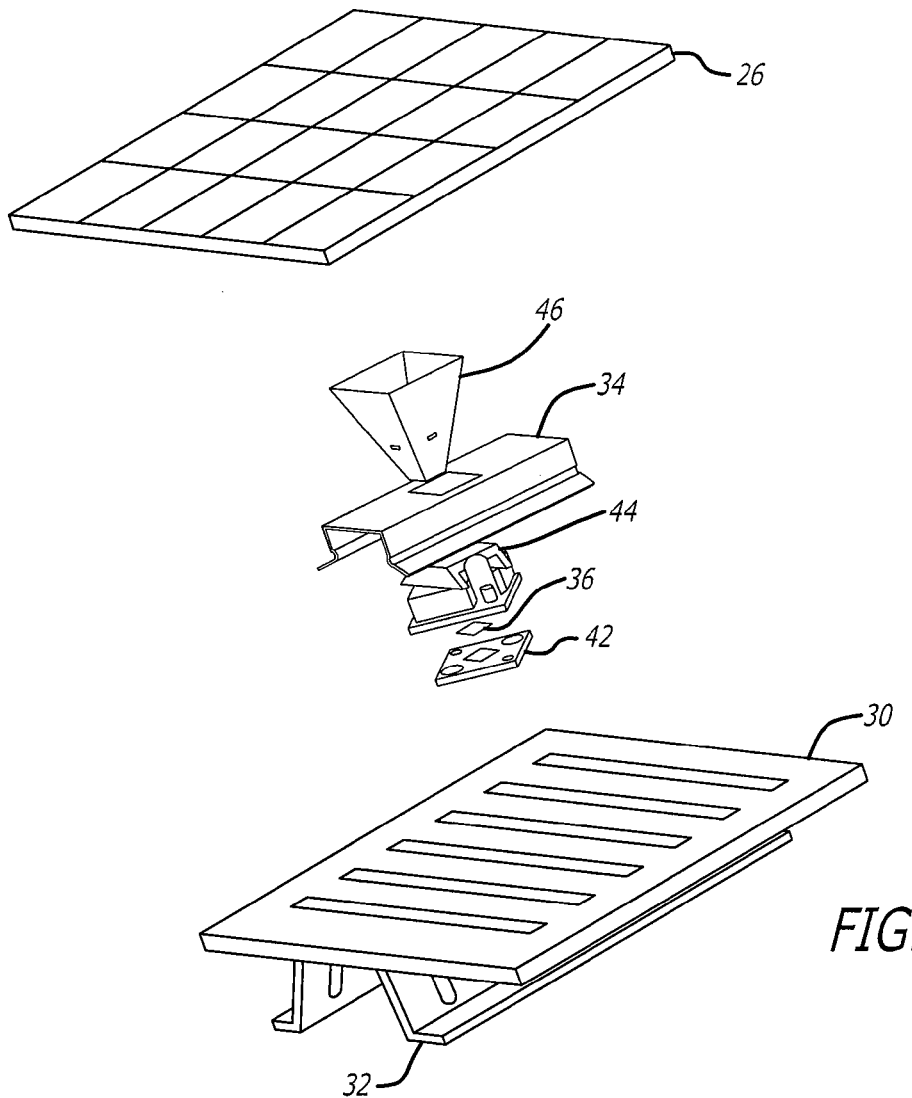
FIG. 5 is an exploded perspective view showing the position between a refractive primary element and a receiver plate upon which the solar cell modular unit is fastened.

One of the solar cell modular units 40 is illustrated in FIG. 4. A substrate 42 has an electrical printed circuit on the top surface thereof. Solar cell 36 is soldered on the printed circuit. A base assembly 44 is mounted over solar cell 36. A sun shield strip 34 is snap locked onto the top of base assembly 44. The secondary optical element (SOE) 46 telescopically passes through cut-out 48 and into the top end of base assembly 44. FIG. 5 shows one of the Fresnel lens 26 spaced above SOE 46. Base assembly 44 is fastened by screws through substrate 42 to receiver plate 30. Receiver plate 30 is mounted on the top of heat sink 32.

Figure 6:
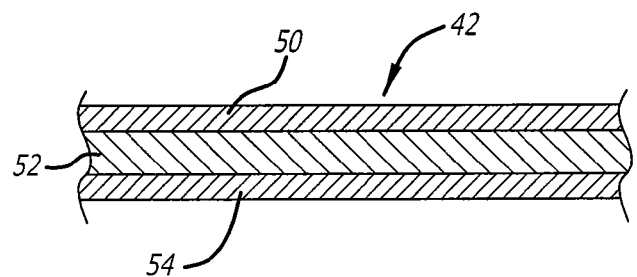
FIG. 6 is a cross sectional view of the substrate.
Figure 7:
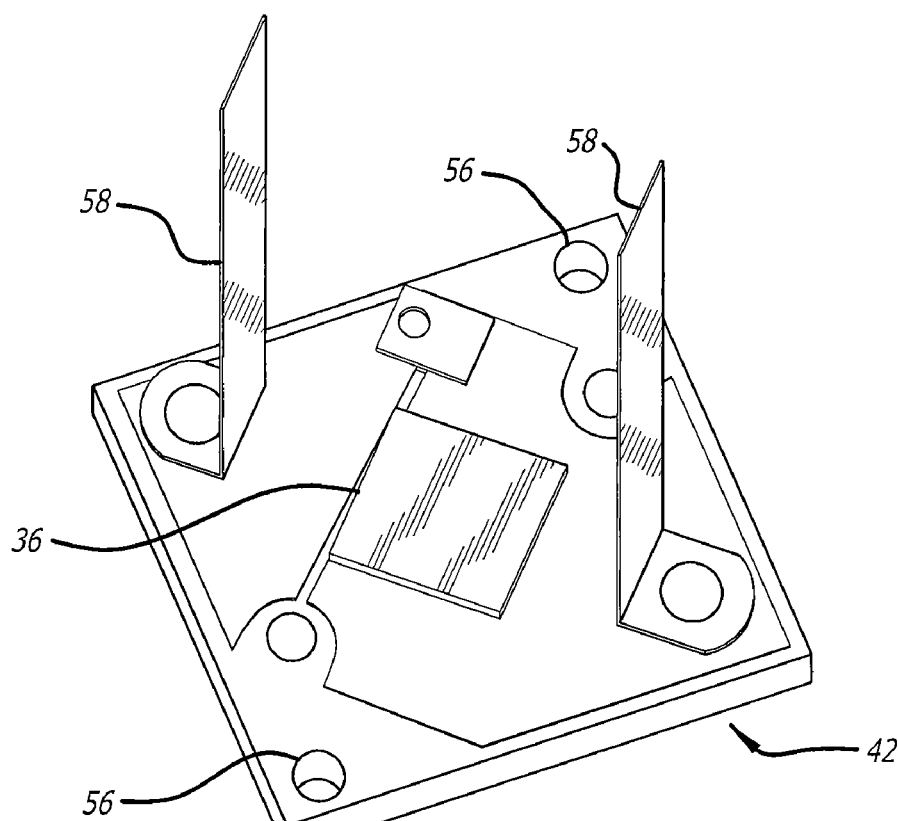
FIG. 7 is a top perspective view of the substrate showing the solar cell soldered onto the printed circuit board.

Substrate 42 is illustrated in FIG. 6. It has an electrically conductive top layer 50, a heat conductive layer 52 that is not electrically conductive and a bottom thermally conductive layer 54. FIG. 7 shows a solar cell 36 soldered to the top of the electrical printed circuit on layer 50 of substrate 42. Apertures 56 receive screws that are inserted through aligned apertures in base assembly 44 and the screws are tightened into receiver plate 30. L-shaped conductor terminals 58 are soldered to the top surface of the electrical printed circuit.

Figure 9:
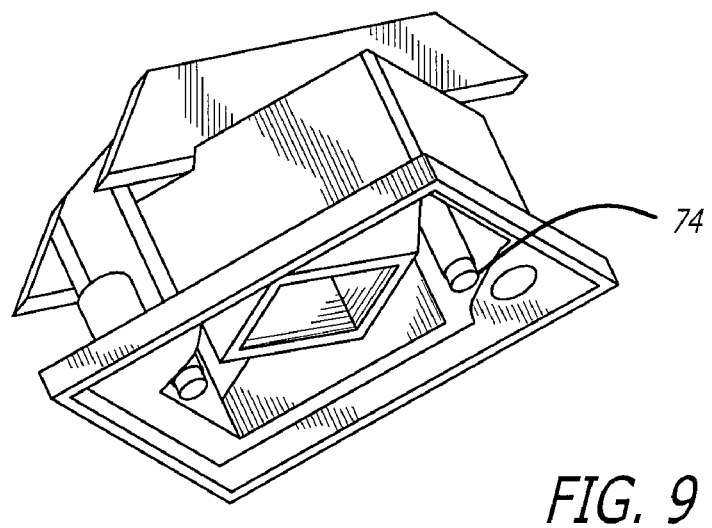
FIG. 9 is a bottom perspective view of the base assembly.
Figure 8:
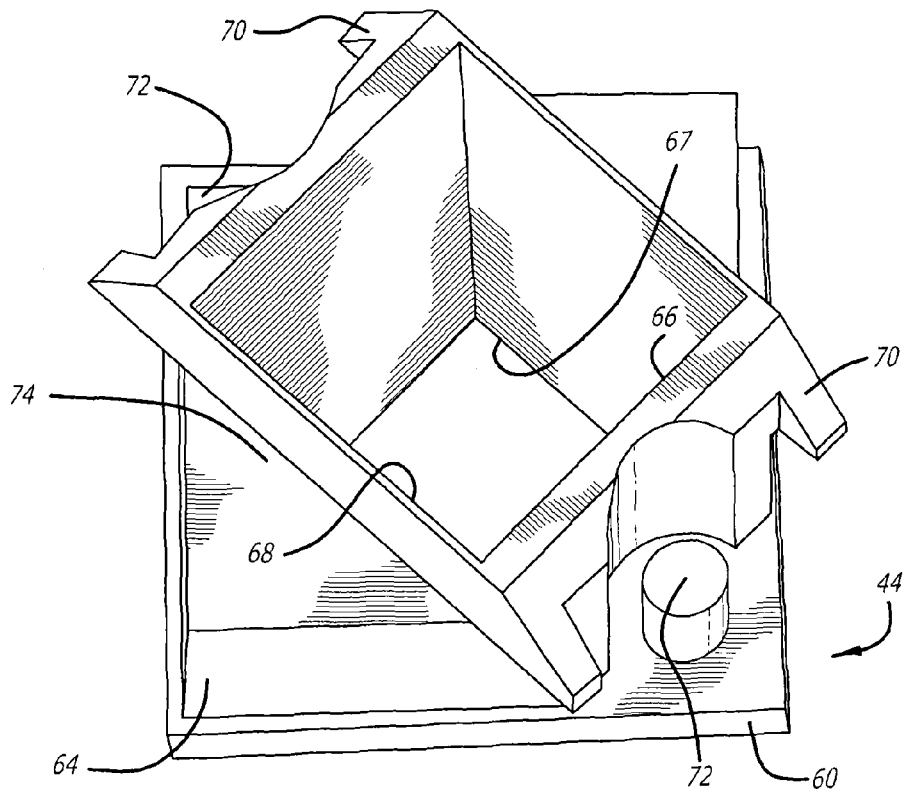
FIG. 8 is a top perspective view of the base assembly.

Base assembly 44 is best illustrated in FIGS. 8 and 9. It has a base plate 60 having a top surface 61 and a bottom surface 62. A tower member 64 extends upwardly from base plate 60. A tunnel 66 extends downwardly from the top end of tower member 64 to the bottom surface of base plate 60. Tunnel 66 has a top opening 68 and a bottom opening 67. Top opening 68 is larger than bottom opening 67 and the respective side walls of tunnel 66 are tapered from its top end to its bottom end. A pair of wings 70 extend downwardly and outwardly from the top end of tower member 64. A pair of boss members 72 extend upwardly form the top surface of base plate 60. FIG. 9 shows a pair of alignment pins 74 that are designed to mate with the substrate for accurate alignment of the SOE 46 to the solar cell 36. A slot 74 is on each side of tower member 64 and each receives one of the L-shaped conductor terminals 58.

Figure 11:
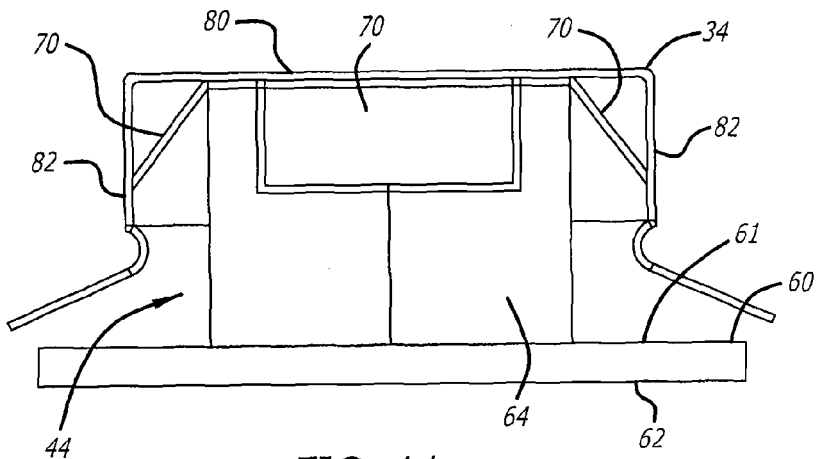
FIG. 11 is a schematic side elevation view showing the receiver snap locked onto the base assembly.
Figure 10:
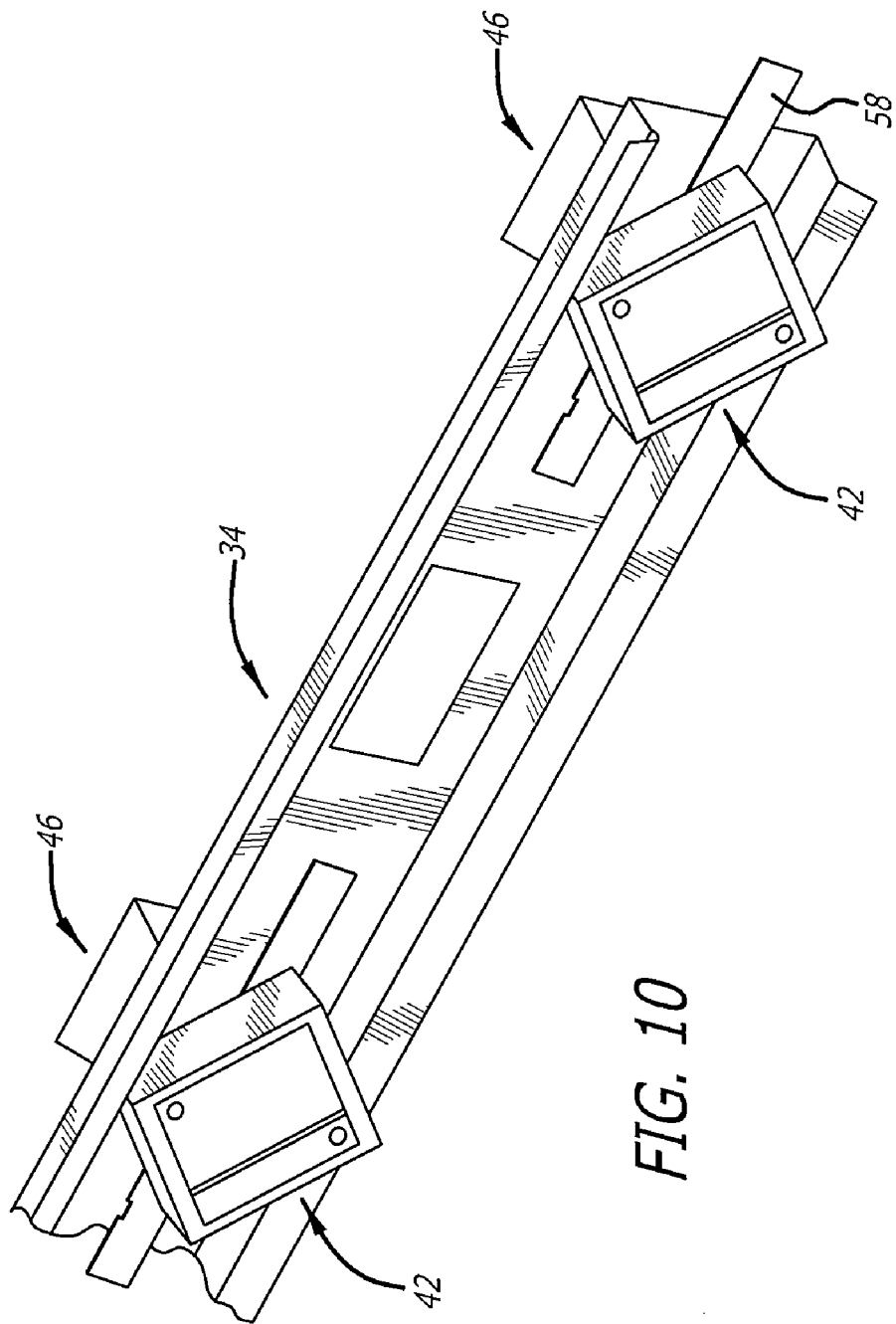
FIG. 10 is a bottom perspective view of the sun shield showing a pair of solar cell modular units installed therein.
Figure 12:
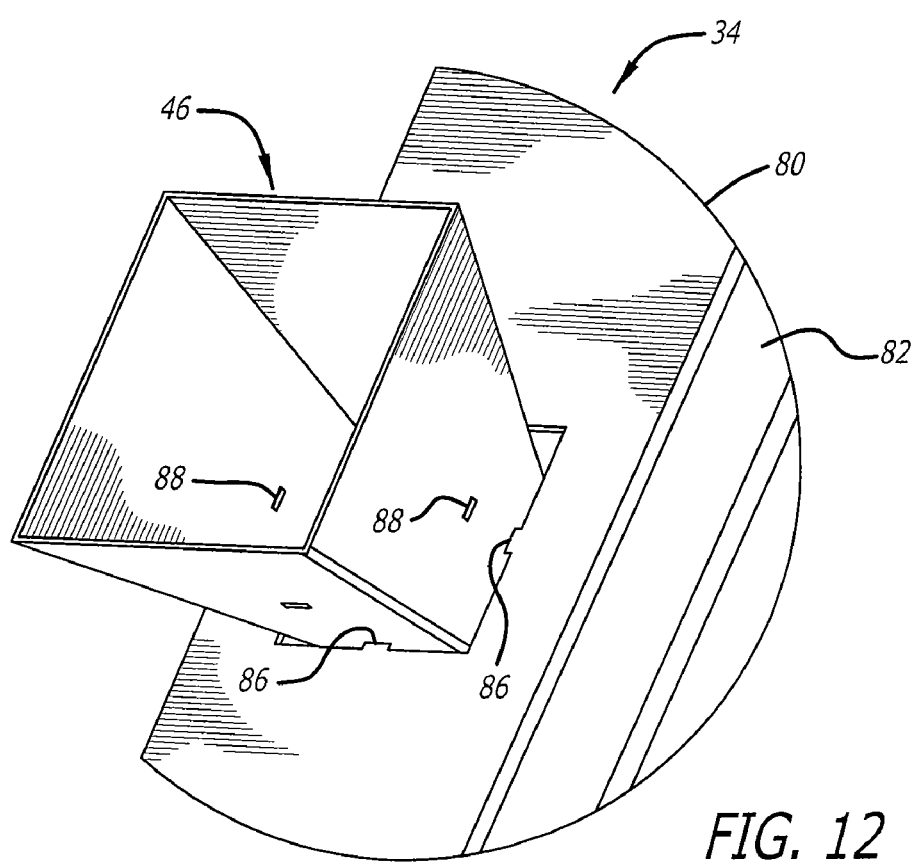
FIG. 12 is a top perspective view illustrating the manner in which the secondary optical element is attached to the sun shield.
Figure 13:
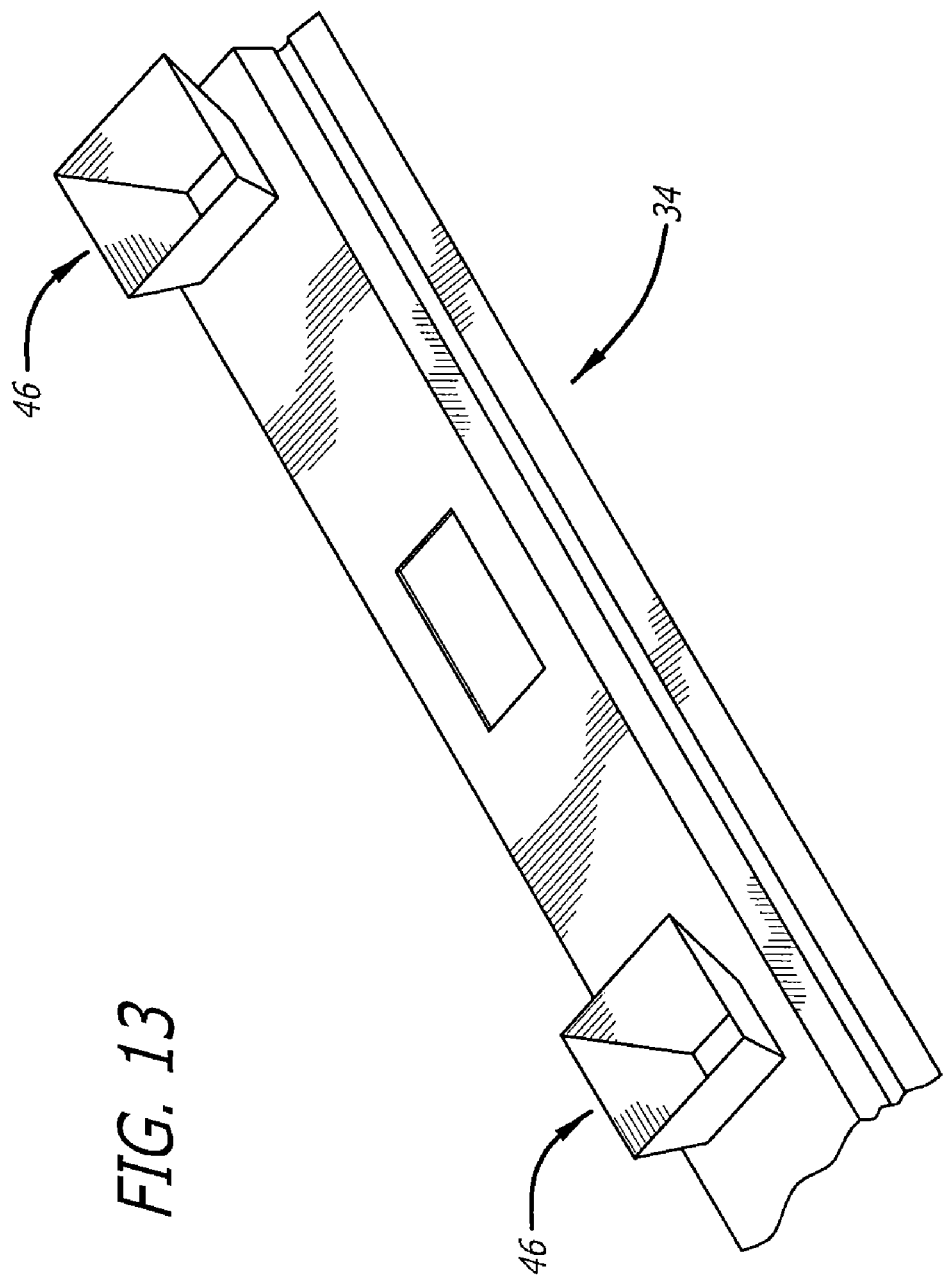
FIG. 13 is a top perspective view showing a pair of secondary optical elements installed in the sun shield.

FIG. 10 is a bottom perspective view of the sun shield 34 showing a pair of solar cell modular units 40 installed therein. FIG. 11 shows the manner in which the sun shield snaps on to the top of base assembly 44. Sun shield 34 has a top panel 80 having resilient arms 82 extending downwardly from its lateral sides. They snap over wings 70 of base assembly 44. FIGS. 12 and 13 show the structure of SOE's 46 mating with top panel 80 of sun shield 34. Tabs 86 mate with slots 88 to provide an easy method of assembly and also to provide a positive locking structure.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and the number and configuration of various components described above may be altered, all without departing from the spirit or scope of the invention as defined in the appended Claims.

The invention claimed is:

1. A solar cell modular unit comprising:
a substrate having a top surface and a bottom surface;
an electrical printed circuit is formed on said top surface;
a solar cell mounted on the top surface of the substrate, the solar cell having a top surface and a bottom surface;
means for connecting said bottom surface of said solar cell to said electrical printed circuit on said top surface of said substrate;
a base assembly mounted to the top surface of the substrate comprising:
a base plate having a top surface and a bottom surface, the bottom surface mounted to the top surface of the substrate,
a tower member having a top end and a bottom end, said bottom end of the tower member being connected to said top surface of said base plate,
a tunnel extends downwardly from said top end of said tower member to said bottom surface of said base plate, said tower member having a top opening having a predetermined configuration and a bottom opening having a predetermined configuration, said top opening being larger than said bottom opening, said tunnel being defined by tapered side walls disposed between said top opening and said bottom opening;
a tapered tubular secondary optical element (SOE) having a top end, a bottom end, surrounding side walls extending from said top end to said bottom end, said side walls having an inner surface defining a top opening and a bottom opening and said top opening being larger than said bottom opening; and
said bottom end of said tapered tubular SOE being telescopically received in said tunnel of said tower member, the bottom end of the tapered tubular SOE cooperating with the tapered side walls of the tunnel to align the SOE to the solar cell while said top end of said tapered tubular SOE remains outside of said tunnel of said tower member.

2. A solar cell modular unit as recited in claim 1 wherein said substrate has laminar structure having an electrically conductive top layer, a central layer of heat conductive material that is not electrically conductive and a bottom layer of thermally conductive material having a high dielectric strength.

3. A solar cell modular unit as recited in claim 2 wherein said substrate has four side edges and four corners.

4. A solar cell modular unit as recited in claim 1 wherein said solar cell is silicon solar cell.

5. A solar cell modular unit as recited in claim 1 wherein said means connecting said solar cell to said electrical printed circuit is solder material.

6. A solar cell modular unit as recited in claim 1 wherein said base plate and said tower member are an integrally formed structure.

7. A solar cell modular unit as recited in claim 6 wherein said integrally formed structure is made of molded plastic material.

8. A solar cell modular unit as recited in claim 6 wherein said base plate has four side edges and four corners.

9. A solar cell modular unit as recited in claim 8 wherein said base plate and said substrate have substantially the same configuration.

10. A solar cell modular unit as recited in claim 1 wherein said inner surface of said side walls of said tubular SOE have reflective properties for directing light rays toward said solar cell.

11. A solar cell modular unit as recited in claim 10 wherein said bottom opening of said tubular SOE and said solar cell have substantially the same configuration.

12. A solar cell modular unit as recited in claim 11 wherein said bottom opening of said SOE and said solar cell each have four side edges and four corners.

13. A solar cell modular unit as recited in claim 1 further comprising a receiver plate having a top surface and a bottom surface and said substrate is secured to said top surface of said receiver plate by fastener means.

14. A solar cell modular unit as recited in claim 13 further comprising an elongated heat sink member having a top surface, wherein the top surface of said heat sink member is secured to said bottom surface of said receiver plate.

15. A solar cell modular unit as recited in claim 14 wherein the vertical cross section of said heat sink member has a hat-shaped configuration.

16. A solar cell modular unit as recited in claim 1 further comprising an elongated sun shield mounted over the base plate and tower member and having a vertical cross section having a hat-shaped configuration that has a top panel having lateral side edges from which extend resilient arms.

17. A solar cell modular unit as recited in claim 16 wherein said top end of said tower member of said base assembly has structure for allowing said resilient arms of said sun shield to be detachably snap-locked to said structure.

18. A solar cell modular unit as recited in claim 16 wherein said top panel of said sun shield has a cut-out aperture configured to telescopically receive the bottom end of said tubular SOE.

19. A solar cell modular unit as recited in claim 1 wherein the tower member further comprises a wing extending outwardly, the wing configured to engage a heat sink member to secure the heat sink member in a predetermined position in relation to the tower.

20. A solar cell modular unit as recited in claim 1 wherein the tower member further comprises a plurality of slots located between the top end of the tower member and the base plate, each slot configured to receive an electrical conductor for contact with the circuit of the substrate.

21. A solar cell modular unit as recited in claim 1 wherein the tunnel comprises a shape that corresponds to the SOE such that when the SOE is received by the tunnel, the tunnel confines the SOE to a predetermined position at which the bottom opening of the SOE faces the solar cell, whereby energy entering the SOE is directed to the solar cell.

22. A solar cell modular unit as recited in claim 1 wherein said bottom end of said tower member has a bottom surface mounted on said base plate.

23. A solar cell modular unit as recited in claim 1 wherein a configuration of said tapered tubular SOE corresponds directly with a configuration of said tapered side walls of said tunnel to independently align said SOE to said solar cell.

24. A solar cell modular unit as recited in claim 1 further comprising one or more alignment pins on said base assembly that register to said substrate to ensure proper alignment of said SOE to said solar cell.

\* \* \* \* \*